United States Patent
Takahashi et al.

(10) Patent No.: US 6,213,610 B1
(45) Date of Patent: Apr. 10, 2001

(54) CATOPTRIC REDUCTION PROJECTION OPTICAL SYSTEM AND EXPOSURE APPARATUS AND METHOD USING SAME

(75) Inventors: Tomowaki Takahashi; Yutaka Suenaga, both of Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/397,883

(22) Filed: Sep. 17, 1999

(30) Foreign Application Priority Data

Sep. 21, 1998 (JP) .................................. 10-266129
Sep. 22, 1998 (JP) .................................. 10-268799

(51) Int. Cl.$^7$ ........................................ G02B 5/10
(52) U.S. Cl. .................... 359/858; 359/859; 359/861; 359/365; 359/366
(58) Field of Search ........................ 359/858, 859, 359/861, 365, 366; 250/492.2

(56) References Cited

U.S. PATENT DOCUMENTS

| | | | |
|---|---|---|---|
| 5,153,898 | 10/1992 | Suzuki et al. | 378/34 |
| 5,686,728 | 11/1997 | Shafer | 250/492.2 |
| 5,815,310 | 9/1998 | Williamson | 359/365 |
| 5,917,879 | 6/1999 | Mashima | 378/34 |

*Primary Examiner*—Mohammad Sikder
(74) *Attorney, Agent, or Firm*—Oliff & Berridge, PLC

(57) ABSTRACT

A catoptric reduction projection optical system (5) is provided with a first catoptric optical system (10) that images an object (R) in first (object) plane (OP) into a second plane (12) and forming an intermediate image (II) therein, and a second catoptric optical system (20) that images the intermediate image in the second plane onto a third (image) plane (IP), thereby forming a reduced image of the object in the first (object) plane onto the third (image) plane. The first catoptric optical system comprises a first mirror pair comprising two reflective mirrors (M1, M2). The second catoptric optical system comprises a second mirror pair comprising a convex mirror (M3) and a concave mirror (M4). The system also preferably satisfied a number of design conditions.

10 Claims, 12 Drawing Sheets

CATOPTRIC REDUCTION PROJECTION OPTICAL SYSTEM AND EXPOSURE APPARATUS AND METHOD USING SAME

FIELD OF THE INVENTION

The present invention relates to photolithography, and in particular to catoptric reduction projection optical systems, and exposure apparatus and exposure methods for fabricating semiconductor and like devices using same.

BACKGROUND OF THE INVENTION

With the advance of micro-miniaturization in recent years in the manufacture of semiconductor and like devices, and semiconductor chip mounting boards, there has been a demand for higher resolving power in the exposure apparatus that prints the patterns therefor. To satisfy this demand, the wavelength of the light source of the exposure apparatus must be shortened and the NA (i.e., numerical aperture of the projection optical system) must be increased. Nevertheless, if the wavelength is shortened, optical glass that can withstand practical use is limited due to the absorption of light. Furthermore, when it comes to the short wavelengths of ultraviolet rays and X-rays, usable optical glass materials are nonexistent. In this case, it is completely impossible to construct a reduction projection optical system as a dioptric optical system or a catoptric optical system.

A catoptric reduction projection optical system is disclosed in, for example, Japanese Patent Application Kokai No. Hei 9-211332. The projection optical system disclosed therein comprises two sets of optical systems comprising reflective surfaces with a concave-convex-concave configuration, and forms an intermediate image between these two sets of reduction projection systems. The system has a total of six reflective surfaces, and so has a large number of degrees of freedom for correcting aberrations. However, it has the problem of a large loss in the quantity of light reaching the image plane due to the excessive number of reflective surfaces. Furthermore, the imaging performance of the overall projection optical system declines due to aberrations generated by manufacturing errors in each reflective surface. Consequently, the system is difficult to manufacture since the tolerance of each reflective surface must be kept extremely tight. Accordingly, although imaging performance from the standpoint of optical design is excellent, there is a risk that the imaging performance of an actually manufactured system will be insufficient.

U.S. Pat. No. 5,153,898 (the '898 patent) discloses another type of catoptric reduction projection optical system wherein X-rays from a reticle are sequentially reflected by a first concave mirror, a convex mirror and a second concave mirror. In addition, the same patent discloses a constitution that prevents interference between the wafer and the X-rays during scanning by arranging a plane mirror between the reticle and the first concave mirror, between the second concave mirror and the wafer, or between both. In the '898 patent, the wafer interferes with rays in the synchronous scanning of the reticle and wafer, inviting the eclipsing of the rays. Furthermore, since the angle at which the X-rays intersect on the plane mirror is on the order of 45°, and since the X-ray reflective mirror is generally constituted by layering a multilayer film, phase shifts arise due to differences in the incident angles, thereby generating aberrations.

U.S. Pat. No. 5,917,879 (the '879 patent) discloses an X-ray lithographic catoptric reduction imaging optical system comprising, objectwise to imagewise, a first concave mirror, a plane mirror, a convex mirror and a second concave mirror arranged coaxially. Each concave mirror and convex mirror are formed as an aspherical surface. The convex mirror is arranged in the pupil plane, and the system is imagewise telecentric. The '879 patent avoids eclipsing of the light beam that occurs when constituting a catoptric optical system with a plurality of mirror systems. However, to do so, the NA on the wafer side is required to be small (0.06). Accordingly, sufficient resolution cannot be obtained.

SUMMARY OF THE INVENTION

The present invention relates to photolithography, and in particular to catoptric reduction projection optical systems, and exposure apparatus and exposure methods for fabricating semiconductor and like devices using same.

Accordingly, the present invention has the objective to achieve extremely excellent imaging performance while keeping the number of reflective surfaces to a relatively small number, and has a further objective to improve the imaging performance of an actually manufactured system.

Accordingly, a first aspect of the invention is a catoptric reduction projection optical system that forms a reduced image of an object present in a first (object) plane onto a third (image) plane. The system comprises, along an optical axis, first and second catoptric optical systems. The first catoptric optical system has two mirrors (a first mirror pair), and forms an intermediate image of the object onto a second plane. The second catoptric optical system has a second mirror pair comprising a convex mirror and a concave mirror, and images the intermediate image onto the third (image) plane. The first and second mirror pairs are positioned so that light from the first plane travels through the first mirror pair, forms the intermediate image in the second plane, then travels through the second mirror pair in the order of the convex mirror and the concave mirror, and then proceeds to form a reduced image of the object in the third plane.

A second aspect of the invention is catoptric reduction imaging optical system capable of forming a reduced image of an object present in a first plane onto a third plane. The system comprises, along an optical axis proceeding in order along an optical path from the first plane to the third plane, a first catoptric reduction imaging system that converges light from the object to form an intermediate image in a second intermediate image plane. The system also includes a second catoptric reduction imaging system that converges light from the intermediate image to form an image in the third plane. The following condition is also preferable satisfied:

$$0.8<|\beta1/\beta|<2$$

wherein $\beta1$ is a reduction magnification of the first catoptric reduction imaging system, and $\beta$ is a combined reduction magnification of the first catoptric reduction imaging system and the second catoptric reduction imaging system.

A third aspect of the invention is a method of exposing a pattern present on a reticle onto a photosensitive substrate. The method comprises the steps of first, illuminating a portion of the reticle with light of a predetermined wavelength, then guiding light from the reticle to a catoptric reduction projection exposure system of the present invention, as described briefly above and in more detail below, so as to form an image of the reticle pattern portion onto the photosensitive substrate, and then scanning the reticle and the photosensitive substrate relative to the catoptric reduction projection exposure system so as to form an image of the entire reticle pattern onto the photosensitive substrate.

DETAILED DESCRIPTION OF THE INVENTION

The present invention relates to photolithography, and in particular to catoptric reduction projection optical systems, and exposure apparatus and exposure methods for fabricating semiconductor and like devices using same.

First Aspect of the Invention

Figure 1:
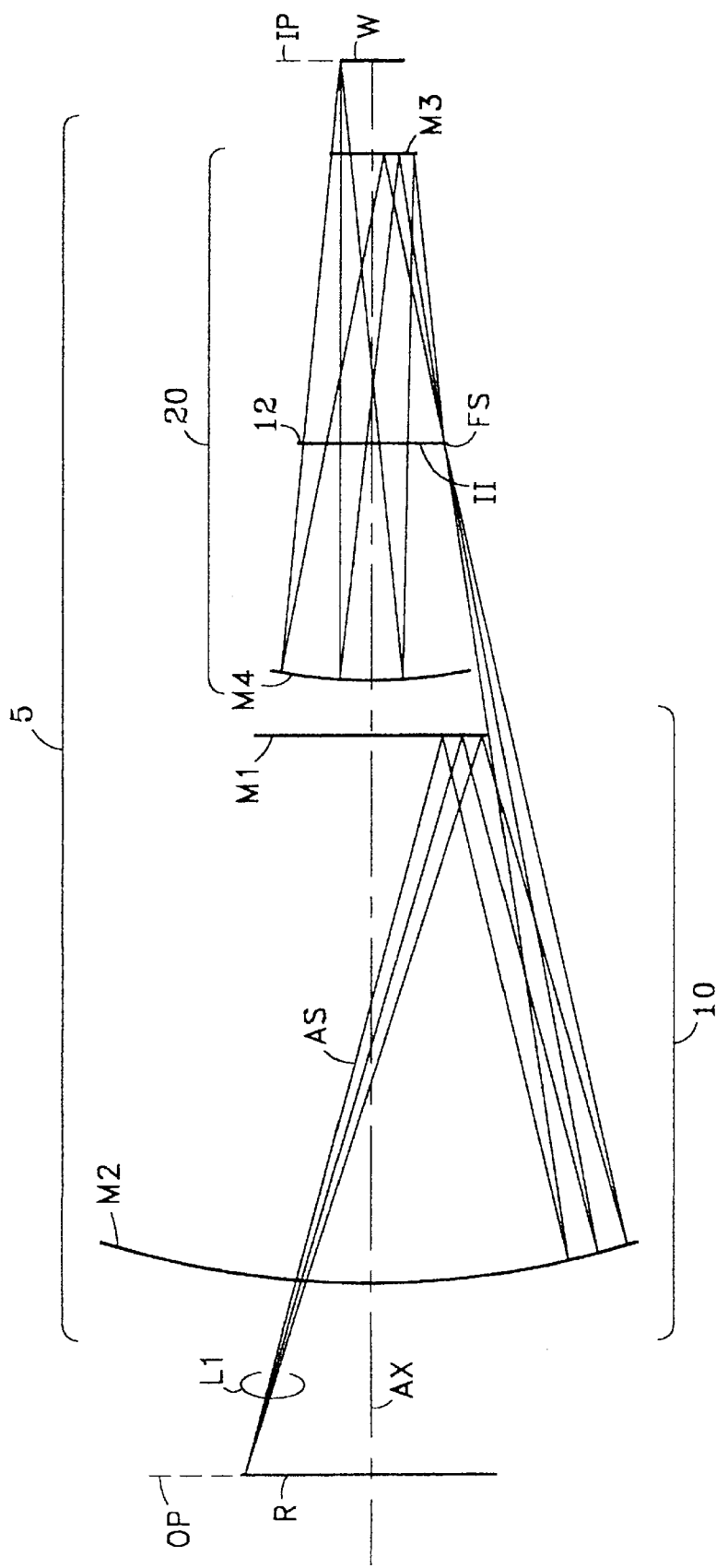
FIG. 1 is a cross-sectional optical diagram of the catoptric reduction projection optical system of Working Example 1 according to the first aspect of the present invention.

The following explains the basic constitution of a catoptric projection optical system according to a first aspect of the present invention, referencing FIG. 1. FIG. 1 is a cross-sectional optical diagram of catoptric reduction projection optical system 5 according to Working Example 1, discussed later. In FIG. 1, the width of the light beam L1 indicates only its lateral cross section. Also, reference to a mirror (e.g., mirror M1) is understood to be referring to a reflective surface thereon, and the terms "mirror" and "reflective surface" are interchangeable. Also, the term "objectwise" refers to first (object) plane OP and "imagewise" refers to third (image) plane IP.

As shown in FIG. 1, catoptric reduction projection optical system 5 of the present invention comprises along an optical axis AX in order along an optical path from a first (object) plane OP to a third (image) plane IP, a first catoptric optical system 10. The latter images an object (hereinafter, reticle R) in first (object) plane OP into a second (intermediate image) plane 12. System 5 also includes a second catoptric optical system 20 arranged between system 10 and third (image) plane IP, which images an intermediate image II formed in second plane 12 onto third (image) plane IP, forming therein a reduced image of reticle R in first (object) plane OP into third (image) plane IP. First catoptric optical system 10 includes a first mirror pair, comprising two mirrors M1 and M2. Second catoptric optical system 20 includes a second mirror pair comprising a convex mirror M3 and a concave mirror M4.

Light L1 from first (object) plane OP forms intermediate image II in second plane 12 after traveling via first mirror pair M1, M2. Light L1 from intermediate image II travels via second mirror pair M3, M4, in the order of convex mirror M3 and concave mirror M4, and then proceeds to third (image) plane IP. A photosensitive substrate, such as a wafer W coated with photoresist, is preferably arranged in third plane IP.

Based on this constitution, a field stop FS can be arranged in second plane 12. In addition, an aperture stop AS can be arranged between the vertices of first mirror pair M1, M2. Here, a vertex is a point where the reference axis of a reflective surface intersects a reflective surface.

If field stop FS is arranged in second plane 12, a corresponding field stop must be provided in the illumination system that illuminates first (object) plane OP.

It is preferable in the present invention to arrange aperture stop AS in the optical path between first (object) plane OP and reflective surface M1, which is the most objectwise of first mirror pair M1, M2. In this case, projection optical system 5 of the present invention has an overall reduction magnification. Therefore, if the objectwise width of light beam L1 can be kept narrow, and aperture stop AS can be arranged in this area, then interference with the projection optical path due to mechanical parts that support aperture stop AS can be avoided. The shape of the aperture of aperture stop AS in this case can be sized to enclose the entire circumference of light beam L1 passing through aperture stop AS. Accordingly, the constitution of an ordinary aperture stop can be employed. At this point, it is preferable to position the optical axis direction of aperture stop AS so that it is imagewise telecentric.

With continuing reference to FIG. 1, it is preferable in the present invention that first catoptric optical system 10 have a reduction magnification, and that second catoptric optical system 20 also have a reduction magnification. Based on this constitution, the reduction magnification of the entire catoptric reduction projection optical system 5 can be shared by each of the catoptric optical systems. This allows the burden on each catoptric optical system 10 and 20 to be lightened.

It is also preferable in the present invention that in first mirror pair M1, M2, mirror M2 be concave and face the intermediate image side (second plane 12 side).

If this constitution is adopted, concave mirror M2, convex mirror M3 and concave mirror M4 approach an Offner-type optical system. However, the constitution of the present invention forms intermediate image II between concave mirror M2 and convex mirror M3. Accordingly, the principle of correcting aberrations is different from that in an Offner-type optical system.

In other words, in an Offner-type optical system modified to have a reduction magnification (hereinafter called a modified Offner-type optical system), the aberrations generated by each of the concave-convex-concave reflective surfaces offset one another. Nevertheless, if the above constitution is adopted in the present invention, the angle of the ray incident concave mirror M2 on the first (object) plane side is greater compared with a modified Offner-type optical system, with respect to the optical axis (reference axis) of concave mirror M2. In other words, the angle formed between the ray incident concave mirror M2 and the ray exiting concave mirror M2 is completely reversed from that of a modified Offner-type optical system.

Therefore, in the case of the above constitution, the travel of the incident and exit rays at the reflective surface of concave mirror M2 of the first mirror pair is completely the reverse direction of that in a modified Offner-type optical system that employs a method of correction wherein the aberrations generated by convex mirror M3 and concave mirror M4 are offset by concave mirror M2.

It is preferable in this constitution to arrange concave mirror M2 in the optical path between mirror M1 and second plane 12. If a ray impinges so that it forms an angle between concave mirror M2 and optical axis AX, as discussed above, then it becomes physically easy to separate, by the reflection at mirror M1, light beam L1 that proceeds from first (object) plane OP to mirror M1, the light beam that proceeds from mirror M1 to concave mirror M2, and the light beam that proceeds from concave mirror M2 to second plane 12. Thereby, the aperture stop AS can be easily arranged in the optical path that proceeds from first (object) plane OP to mirror M1.

To achieve better optical performance, it is preferable in the present invention that third (image) plane IP be flat. To flatten third (image) plane IP as much as possible, the Petzval sum of first catoptric optical system 10 and second catoptric optical system 20 should each be made as small as possible.

Accordingly, it is preferable to satisfy the following condition for first catoptric optical system 10:

$$-0.005<(C1-C2)<0.005 \quad (1)$$

wherein C1 and C2 are respectively the curvatures of mirrors M1, M2 that constitute the first mirror pair.

If (C1−C2) falls below the lower limit in condition (1), second (intermediate) image plane 12 curves excessively concavely, unfortunately exceeding the range wherein convex mirror M3 in second catoptric optical system 20 can be corrected. This leads to a deterioration in the image of field stop FS. In addition, if (C1−C2) exceeds the upper limit in condition (1), second (intermediate) image plane 12 curves excessively convexedly, unfortunately exceeding the range wherein concave mirror M4 in second catoptric optical system 20 can be corrected. This also leads to a deterioration in the image of field stop FS.

It is also preferable to satisfy the following condition for second catoptric optical system 20:

$$-0.005<(C3-C4)<0.005 \quad (2)$$

wherein C3 is the curvature of convex mirror M3 and C4 is the curvature of concave mirror M4.

If (C3−C4) falls below the lower limit in condition (2), third (image) plane IP curves excessively concavely, unfortunately exceeding the range wherein convex mirror M3 can be corrected. On the other hand, if (C3−C4) exceeds the upper limit in condition (2), third (image) plane IP curves excessively convexedly, unfortunately exceeding the range wherein concave mirror M4 can be corrected.

It is preferable to constitute the overall catoptric reduction projection optical system 5 so that the Petzval sum generated by the two mirror pairs in systems 10, 20 offset one another. Accordingly, it is preferable in the present invention to satisfy the following condition:

$$-0.005<(C1-C2)+(C3-C4)<0.005 \quad (3)$$

If (C1−C2)+(C3−C4) falls below the lower limit in condition (3), third (image) plane IP curves excessively concavely, unfortunately exceeding the range wherein convex mirror M3 can be corrected. In addition, if (C1−C2)+ (C3−C4) exceeds the upper limit in condition (3), third (image) plane IP curves excessively convexedly, unfortunately exceeding the range wherein concave mirrors M2, M4 can be corrected.

Accordingly, if the present invention is constituted so that the above conditions (1) to (3) are simultaneously satisfied, the curvature of third (image) plane IP can be extremely satisfactorily corrected.

It is preferable in the present invention that first catoptric optical system 10 comprise only two mirrors M1, M2, and that second catoptric optical system 20 comprise only two mirrors M3, M4. Thereby, if catoptric reduction projection optical system 5 of the present invention is applied to a projection exposure apparatus that uses, as the exposure light, light in the soft X-ray region having a wavelength of 5 to 15 nm (this light is called "EUV (Extreme Ultra Violet) light" in the present specification), or light in the hard X-ray region with a shorter wavelength, a sufficient quantity of light can be ensured for practical purposes even if the reflectance of the reflective film in the corresponding wavelength region is low. This is because there are only four reflective surfaces. Furthermore, the catoptric reduction projection optical system of the present invention has the advantage that the risk of a deterioration in imaging performance due to errors in the surface shape of reflective surfaces is small.

It is also preferable in the present invention to arrange mirrors M1, M2 and mirrors M3, M4 along optical axis AX. Thereby, the assembly and adjustment of mirrors M1 to M4 in a lens barrel is simplified.

It is additionally preferable in the present invention to arrange first catoptric optical system 10 and second catoptric optical system 20 so that they have a predetermined axial spacing. Thereby, since the round-trip optical path formed between mirrors M1 to M4 can be reduced, the number of mirrors that have an off-axis shape (i.e., a shape having an asymmetric outline with respect to the reference axis) can be reduced.

It is further preferable in the present invention that at least two mirrors M1, M4 among the plurality of mirrors M1 to M4 that constitute catoptric reduction projection optical system 5 each have an outer diameter symmetric with respect to its reference axis. Thereby, the difficulty of the procedures for manufacturing the mirrors is lessened, and the assembly and adjustment procedures are simplified.

It is also preferable in the present invention to form the surface shape of each of the plurality of mirrors as a rotationally symmetric aspherical surface.

Figure 2:
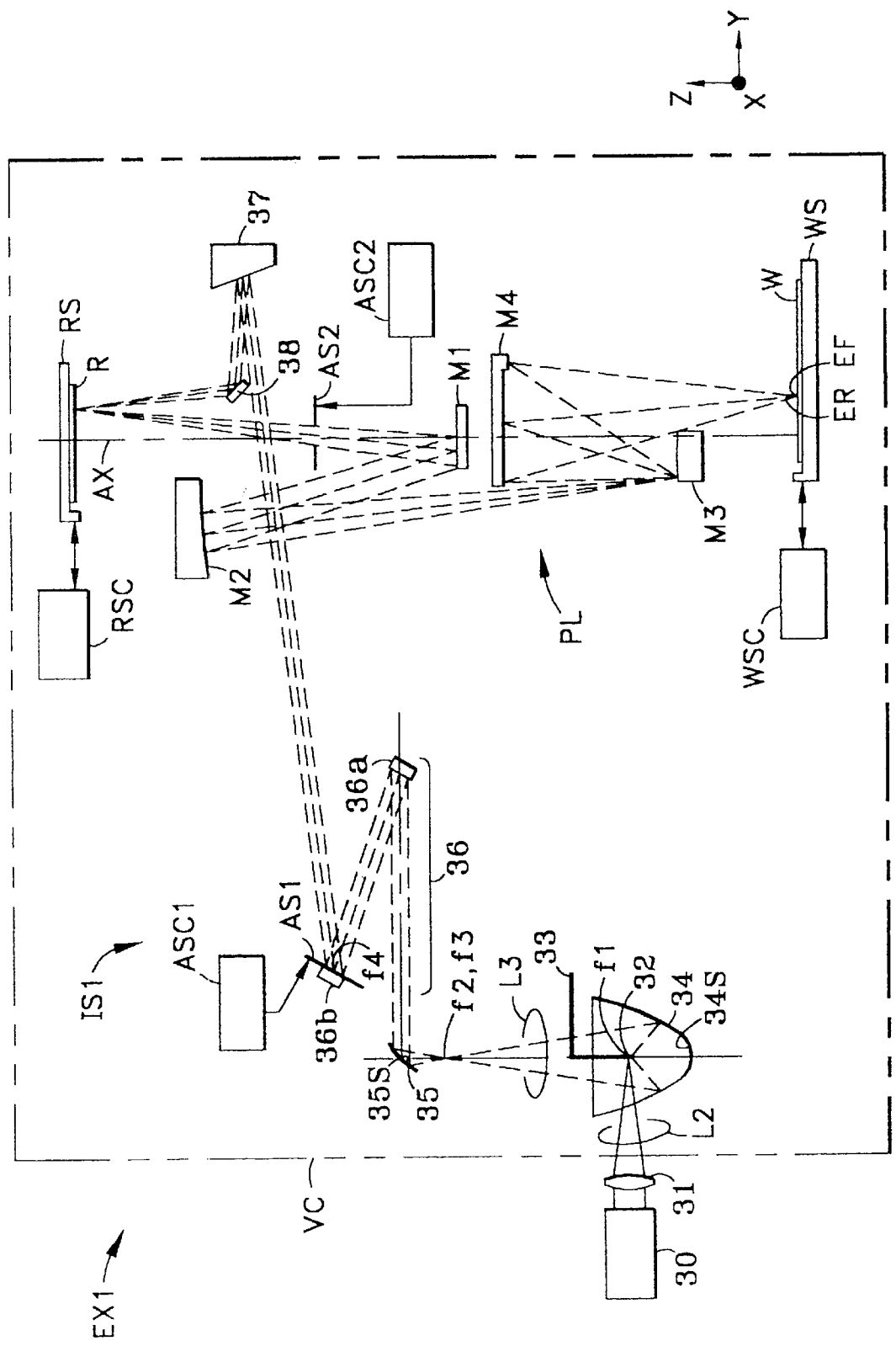
FIG. 2 is a schematic diagram of an exposure apparatus provided with the catoptric reduction projection optical system according to the first aspect of the present invention.
Figure 3A:
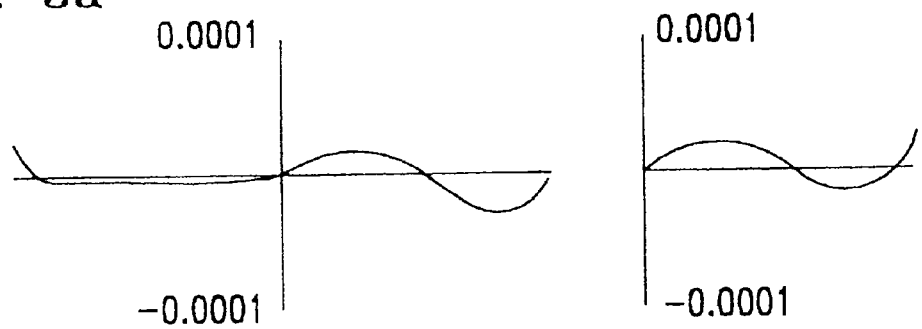
FIGS. 3a–3c are meridional and sagittal comatic aberration plots for Working Example 1 of FIG. 1 for object height Y=122 mm (FIG. 3a), Y=120 mm (FIG. 3b) and Y=118 mm (FIG. 3c)
Figure 3B:
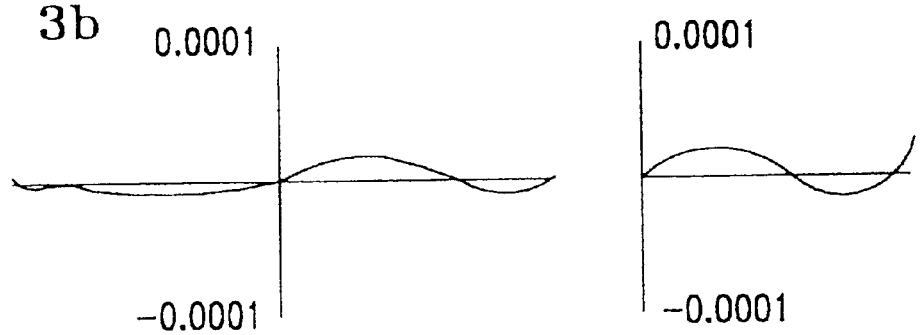
Figure 3C:
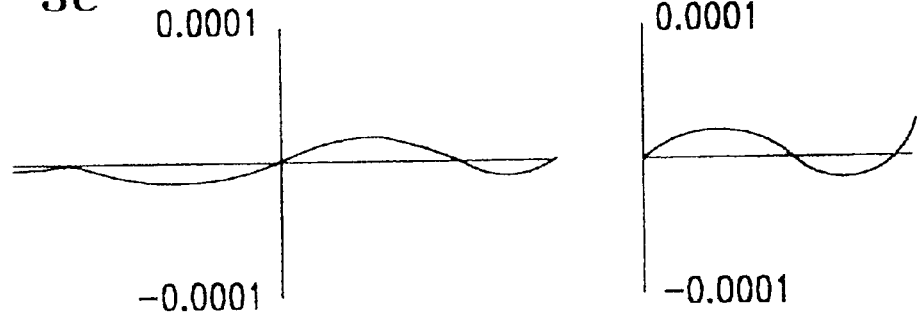

The following explains a projection exposure apparatus EX1 wherein the catoptric reduction projection optical system PL according to the present invention is installed, referencing FIG. 2. An exemplary catoptric reduction projection optical system PL is system 5, described above.

FIG. 2 schematically illustrates the overall construction of projection exposure apparatus EX1 wherein catoptric reduction projection optical system PL according to a first aspect of the present invention is installed. Projection exposure apparatus EX1 uses light in the soft X-ray region having a wavelength on the order of 5 to 15 nm (EUV light) as the illumination light for exposure. The exposure operation is a step-and-scan method. In FIG. 2, the Z direction is the axial (AX) direction of catoptric reduction projection optical system PL that forms a reduced image of catoptric reticle R as the projection master plate onto a wafer W. The Y direction is a direction orthogonal to the Z direction and inside the paper plane, and the X direction is a direction orthogonal to the Y and Z directions and perpendicular to the paper plane. Reticle R includes a pattern (not shown) to be transferred to wafer W.

Projection exposure apparatus EX1 transfers, by a step-and-scan method, the entire circuit pattern of catoptric reticle R onto each of a plurality of exposure regions ER on wafer W. This is accomplished by scanning reticle R and wafer W in a one-dimensional direction (herein, the Y axis direction) relative to catoptric reduction projection optical system PL while projecting the image of one part of a circuit pattern on catoptric reticle R onto wafer W as the photosensitive substrate via catoptric reduction projection optical system PL.

Since EUV light has low transmittance with respect to the atmosphere, the optical path through which the EUV light passes is cut off from outside air by enclosing it in vacuum chamber VC.

With continuing reference to FIG. 2, the illumination optical system IS1 of exposure apparatus EX1 is now explained. Illumination optical system IS1 includes a laser light source 30 that supplies laser light L2 having a wavelength in a range from the infrared region to the visible region. Laser light source 30 may be, for example, a semiconductor laser-excited YAG laser or excimer laser. Laser light L2 is condensed by a first condenser optical system 31 and converges light L2 at position 32. A nozzle 33 jets gaseous matter toward position 32, and this jetted matter is subject to laser light L2 of high illumination intensity at position 32. The jetted matter rises in temperature due to the energy of the laser light L2, is excited to the plasma state, and discharges EUV light L3 when it transitions to a low potential state.

An ellipsoidal mirror 34 that constitutes a second condenser optical system is arranged around position 32. Ellipsoidal mirror 34 with an inner surface 34S is positioned so that its first focal point f1 substantially coincides with position 32. Inner surface 34S of ellipsoidal mirror 34 is provided with a multilayer film for reflecting EUV light L3. EUV light L3 reflected thereby converges at a second focal point f2 of ellipsoidal mirror 34 and then proceeds to a parabolic mirror 35 with an inner surface 35S that constitutes a third condenser optical system. Parabolic mirror 35 is positioned so that its focal point f3 substantially coincides with second focal point position f2 of ellipsoidal mirror 34. Inner surface 35S is provided with a multilayer film for reflecting EUV light L3.

EUV light L3 emitted from parabolic mirror 35 proceeds in a substantially collimated state to a catoptric flyeye optical system 36, which serves as an optical integrator. Catoptric flyeye optical system 36 comprises a first catoptric element group 36a that integrates a plurality of reflective surfaces, and a second catoptric element group 36b having a plurality of reflective surfaces corresponding to the plurality of reflective surfaces of first catoptric element group 36a. A multilayer film for reflecting EUV light L3 is also provided on the plurality of reflective surfaces that constitutes first and second catoptric element groups 36a, 36b.

The wavefront (not shown) of collimated EUV light L3 from parabolic mirror 35 is divided by first catoptric element group 36a. EUV light L3 from each of these reflective surfaces converges and forms a plurality of light source images (not shown). The plurality of reflective surfaces of second catoptric element group 36b is positioned in the vicinity of where the plurality of light source images is formed. The plurality of reflective surfaces of second catoptric element group 36b substantially serves the function of a field mirror. Thus, catoptric flyeye optical system 36 forms a plurality of light source images as secondary light sources using the approximately parallel light beam from parabolic mirror 35.

In the present mode for carrying out the present invention, a σ stop AS1 is provided in the vicinity of second catoptric element group 36b to control the shape of the secondary light sources. σ stop AS1 comprises, for example, a turret (not shown) on which is provided a plurality of openings having different shapes. A σ stop control unit ASC1 is operatively connected to σ stop AS1 and controls which opening is arranged in the optical path.

EUV light L3 from the secondary light sources formed by catoptric flyeye optical system 36 proceeds to a condenser mirror 37 positioned so that its focal point position f4 is at the vicinity of the position of the secondary light sources. EUV light L3 is reflected and condensed by condenser mirror 37, and then arrives on catoptric reticle R via a folding mirror 38. A multilayer film that reflects EUV light L3 is provided on condenser mirror 37 and folding mirror 38. Condenser mirror 37 converges EUV light L3 emitted from the secondary light sources, and superimposingly and uniformly illuminates catoptric reticle R.

In the present mode for carrying out the present invention, it is necessary to spatially separate the optical path of the illumination EUV light L3 that proceeds to catoptric reticle R and the optical path of the EUV light reflected by catoptric reticle R and that proceeds to projection system PL. Accordingly, illumination optical system IS is a non-telecentric system, and catoptric reduction projection optical system PL is also a non-telecentric optical system on the reticle side (i.e., objectwise non-telecentric).

A reflective film comprising a multilayer film that reflects EUV light is provided on catoptric reticle R. This reflective film forms the aforementioned pattern to be transferred onto wafer W as the photosensitive substrate. EUV light L3 reflected by catoptric reticle R includes the pattern information of catoptric reticle R and enters catoptric reduction projection optical system PL.

As previously explained in connection with FIG. 1, catoptric reduction projection optical system 5 comprises four mirrors M1 to M4. Also, aperture stop AS may be a variable aperture stop AS2, such as shown in system PL, arranged in the optical path between mirror M1 and catoptric reticle R (i.e., between the vertices of mirror M1 and mirror M2). Variable aperture stop AS2 is constituted so that the aperture of its opening is variable, and is controlled by a variable aperture stop control unit ASC2, operatively connected thereto.

In addition, field stop FS is arranged at the intermediate image forming position in the optical path between mirror M2 and mirror M3 (see FIG. 1). A multilayer film that reflects EUV light L3 is provided on mirrors M1 to M4.

EUV light L3 reflected by catoptric reticle R passes through catoptric reduction projection optical system PL, and forms a reduced image of the pattern of catoptric reticle R with predetermined reduction magnification β (for example, $|\beta|=\frac{1}{4}, \frac{1}{5}, \frac{1}{6}$) in an arcuate exposure region ER on wafer W. In the present mode for carrying out the present invention, the shape of exposure region ER is specified by field stop FS provided in catoptric reduction projection optical system PL.

With continuing reference to FIG. 2, catoptric reticle R is supported by a reticle stage RS moveable at least along the Y direction. Wafer W is supported by a wafer stage WS moveable along the X, Y and Z directions. The movement of reticle stage RS and wafer stage WS is controlled by a reticle stage control unit RSC and wafer stage control unit WSC, respectively, in electronic communication with the reticle and wafer stages. When performing the exposure operation, catoptric reticle R is irradiated with EUV light L3 by illumination system IS. Catoptric reticle R and wafer W are then moved with respect to catoptric reduction projection optical system PL at a predetermined speed ratio prescribed by the reduction magnification of the projection system. Thereby, the pattern of catoptric reticle R is scanned and exposed onto a predetermined exposure field EF on wafer W.

It is preferable in the present mode for carrying out the present invention to make σ stop AS1, variable aperture stop AS2 and field stop FS from a metal like Au, Ta or W to sufficiently block EUV light L3.

WORKING EXAMPLES

Figure 4:
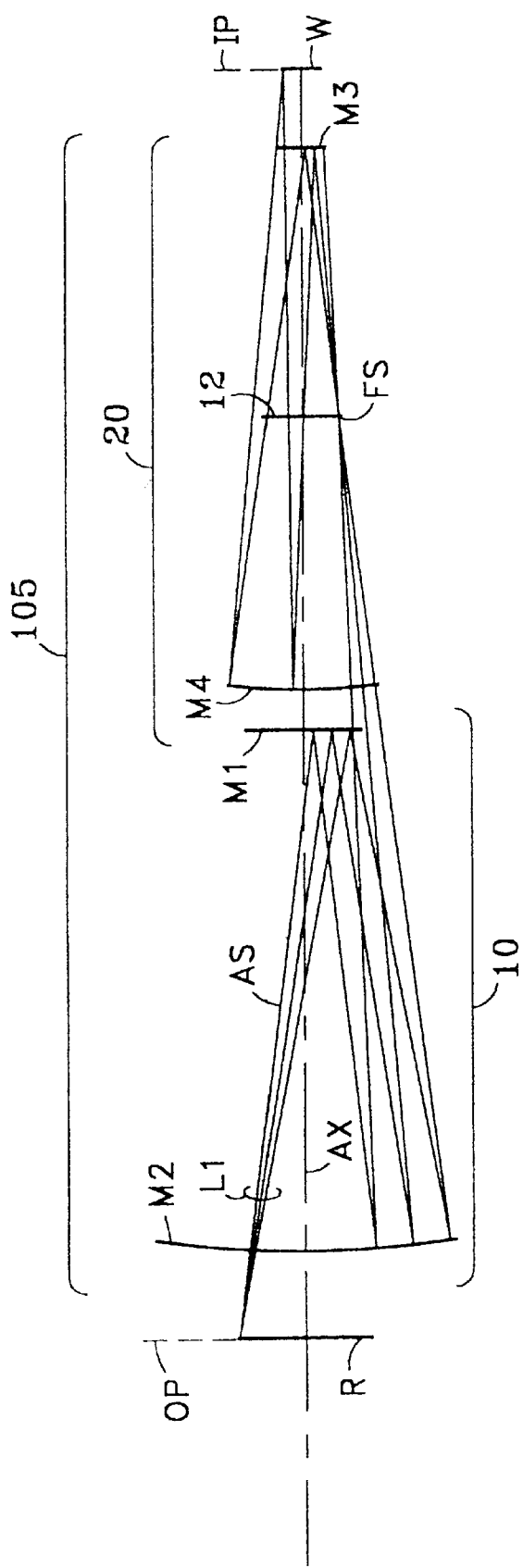
FIG. 4 is a cross-sectional optical diagram of the catoptric reduction projection optical system of Working Example 2 according to the first aspect of the present invention.
Figure 5A:
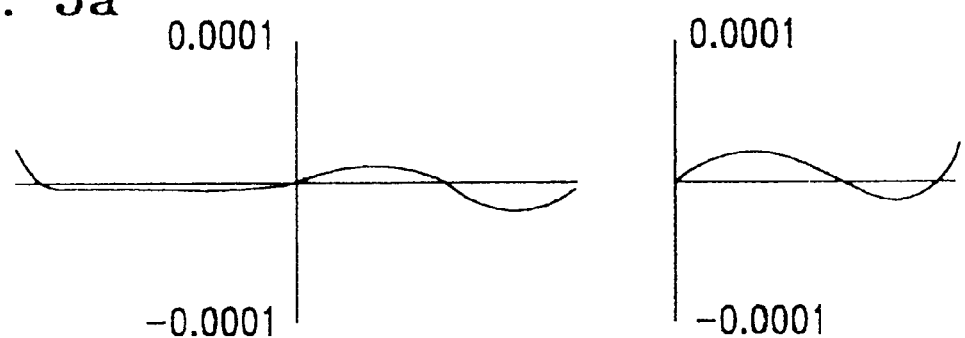
FIGS. 5a–5c are meridional and sagittal comatic aberration plots for Working Example 2 of FIG. 4 for object height Y=62 mm (FIG. 5a), Y=60 mm (FIG. 5b) and Y=58 mm (FIG. 5c)
Figure 5B:
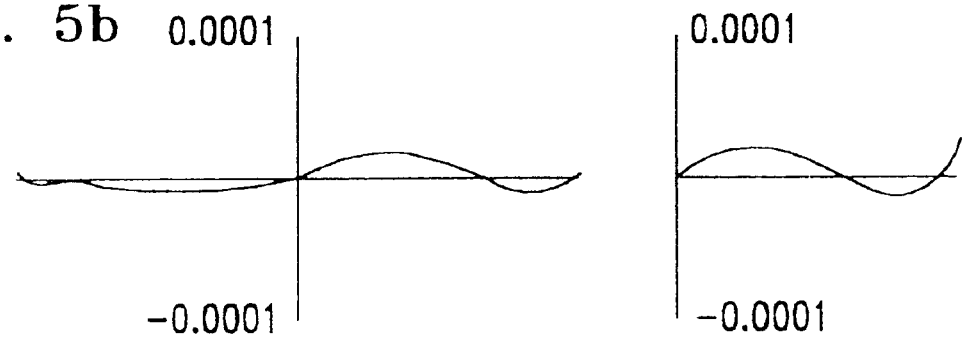
Figure 5C:
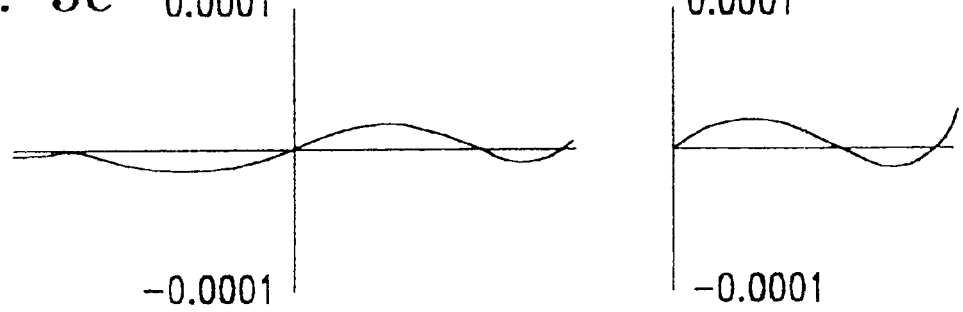

The following sets forth two numerical Working Examples of the catoptric reduction projection optical system according to the first aspect of the present invention. FIG. 1 is a cross-sectional optical diagram of the catoptric reduction projection optical system 5 of Working Example 1, as described above. FIG. 4 is a cross-sectional optical diagram of a catoptric reduction projection optical system 105 of Working Example 2. FIGS. 1 and 4 show only the lateral cross-sectional width of the light beams L1.

Catoptric reduction projection optical systems 5 and 105 of Working Example 1 and Working Example 2, respectively, have the general arrangement as described above with regard to system 5 of FIG. 1. Furthermore, in Working Example 1 shown in FIG. 1, mirror M1 has a rotationally symmetric aspherical surface shape having no paraxial power. In Working Example 2 shown in FIG. 4, mirror M1 has a rotationally symmetric aspherical surface having a concave shape. In addition, mirror M2 has a rotationally symmetric aspherical surface having a concave shape.

Furthermore, in systems 5 and 105 of Working Examples 1 and 2 respectively, mirrors M1 to M4 are arranged coaxially along common optical axis AX, and aperture stop AS is arranged in the optical path that is optical axis AX between first (object) plane OP and mirror M1.

In addition, the light from first (object) plane OP travels sequentially via aperture stop AS, mirror M1 and mirror M2 and forms a reduced intermediate image II in second plane 12. Light from reduced image II travels sequentially via mirror M3 and mirror M4, reaches third (image) plane IP, and forms a reduced image in the third plane.

As discussed above, each of the reflective mirrors M1 to M4 in Working Example 1 and Working Example 2 has an aspherical surface shape expressed by the following formula.

$$Y=(cr^2)/[1+\{1+k\}(c^2r^2)^{0.5}]+Ar^4+Br^6+Dr^{10}+Er^{12}+Fr^{14}$$

wherein,
- Y: Distance from central tangential plane to aspherical surface,
- c: Center curvature,
- r: Distance from optical axis,
- k: Conical constant,
- A: Fourth-order aspherical coefficient,
- B: Sixth-order aspherical coefficient,
- C: Eighth-order aspherical coefficient,
- D: Tenth-order aspherical coefficient,
- E: Twelfth-order aspherical coefficient, and
- F: Fourteenth-order aspherical coefficient.

In catoptric reduction projection optical system 5 of Working Example 1, the reduction magnification $|\beta|$ is ¼×, imagewise numerical aperture NA is 0.1, and the maximum object height is 120 mm. Exposure region ER is an annular shape having a radius of 30 mm and width of 1 mm. Furthermore, by performing scanning exposure, an overall exposure field of 26×33 mm is possible. The distance between first (object) plane OP and third (image) plane IP is 1,451 mm. The maximum effective diameter among the effective diameters of the plurality of reflective mirrors M1 to M4 is 542 mm.

In the catoptric reduction projection optical system 105 of Working Example 2, the reduction magnification $|\beta|$ is ¼×, imagewise numerical aperture NA is 0.1, and the maximum object height is 60 mm. Exposure region ER is an annular shape having a radius of 15 mm and width of 1 mm. Furthermore, by performing scanning exposure, an overall exposure field of 26×33 mm can be exposed. In addition, the distance between the first (object) plane OP and third (image) plane is 1,279 mm. The maximum effective diameter among the effective diameters of the plurality of reflective mirrors M1 to M4 is 306 mm.

Table 1 to Table 4 below list the values of the specifications of the catoptric reduction projection optical systems of Working Example 1 and Working Example 2. In Table 1 and Table 3, the left column indicates the surface number of each reflective surface, RDY indicates the radius of curvature of each optical surface, and THI indicates the surface spacing between each reflective surface. Furthermore, the RDY column indicates the paraxial radius of curvature of each reflective surface, and the THI column indicates each surface spacing. In Table 1 and Table 3, D0 is the distance from first (object) plane OP to the most objectwise optical surface, WD is the distance from the most imagewise optical surface to the third (image) plane IP, β is the lateral magnification of the catoptric reduction projection optical system when light from the first (object) plane side enters the catoptric reduction projection optical system, and NA is the imagewise numerical aperture. In Table 1 and Table 2, the sign of paraxial radius of curvature RDY is positive when convex toward the first (object) plane OP side, and the sign of surface spacing THI reverses after a reflective surface. Table 2 and Table 4 list the aspherical surface data for mirrors M1 to M4 in Working Example 1 and Working Example 2. Table 5 below lists the numerical values corresponding to conditions (1)–(3).

TABLE 1

D0 = 430.079395
WD = 642.640534
$|\beta|$ = 0.2498
NA = 0.1

| Surface No. | RDY | THI | |
|---|---|---|---|
| 0 | ∞ | 430.079395 | First plan 11 (object plane) |
| 1 | ∞ | 328.252083 | Aperture stop AS |
| 2 | ∞ | −567.459189 | Mirror M1 |
| 3 | 1042.96191 | 871.304731 | Mirror M2 |
| 4 | ∞ | 293.356081 | Second plane 12 (intermediate image plane) |
| 5 | 409.29671 | −547.201623 | Mirror M3 |
| 6 | 655.87223 | 642.640534 | Mirror M4 |
| 7 | ∞ | | Third plane 13 (last image plane) |

TABLE 2

Aspherical Surface Data of Working Example 1

Mirror M1 k = 0.0
A = −0.880464 × 10⁻⁰⁹
B = 0.574681 × 10⁻¹⁴
C = −0.649958 × 10⁻¹⁹
D = 0.458803 × 10⁻²⁴

Mirror M2 k = 0.0
A = −0.470138 × 10⁻¹⁰
B = −0.817504 × 10⁻¹⁶
C = −0.203736 × 10⁻²²
D = −0.678385 × 10⁻²⁷

Mirror M3 k = 0.0
A = 0.832308 × 10⁻⁰⁸
B = 0.103672 × 10⁻¹²
C = −0.175930 × 10⁻¹⁶
D = 0.700374 × 10⁻²⁰

Mirror M4 k = 0.0
A = 0.162223 × 10⁻¹⁰
B = 0.692754 × 10⁻¹⁶
C = −0.622518 × 10⁻²¹
D = 0.193427 × 10⁻²⁵

TABLE 3

D0 = 421.533199
WD = 626.912313
|β| = 0.2500
NA = 0.1

| Surface No. | RDY | THI | |
|---|---|---|---|
| 0 | ∞ | 421.533199 | First plan 11 (object plane) |
| 1 | ∞ | 195.113908 | Aperture stop AS |
| 2 | 2430.13474 | −533.860357 | Mirror M1 |
| 3 | 894.29705 | 851.779609 | Mirror M2 |
| 4 | ∞ | 271.729305 | Second plane 12 (intermediate image plane) |
| 5 | 449.09562 | −553.918512 | Mirror M3 |
| 6 | 651.05560 | 626.912313 | Mirror M4 |
| 7 | ∞ | | Third plane 13 (last image plane) |

TABLE 4

Aspherical Surface Data of Working Example 2

Mirror M1 k = 0.0
A = −0.469482 × 10⁻⁰⁸
B = 0.128696 × 10⁻¹²
C = −0.200847 × 10⁻¹⁶
D = 0.296244 × 10⁻²⁰

Mirror M2 k = 0.0
A = −0.551632 × 10⁻¹⁰
B = −0.534445 × 10⁻¹⁶
C = −0.209735 × 10⁻²⁰
D = −0.217365 × 10⁻²⁵

Mirror M3 k = 0.0
A = 0.627931 × 10⁻⁰⁸
B = −0.285097 × 10⁻¹²

TABLE 4-continued

Aspherical Surface Data of Working Example 2

C = 0.382388 × 10⁻¹⁵
D = −0.187678 × 10⁻¹⁸

Mirror M4 k = 0.0
A = 0.573585 × 10⁻¹¹
B = 0.668044 × 10⁻¹⁶
C = 0.250251 × 10⁻²⁰
D = −0.168080 × 10⁻²⁴

TABLE 5

| | Working Example 1 | Working Example 2 |
|---|---|---|
| C1 | 0.000000 | 0.0004115 |
| C2 | 0.0009588 | 0.0011182 |
| C3 | 0.0024432 | 0.0022267 |
| C4 | 0.0015246 | 0.0015359 |
| (1) (C1–C2) | −0.000959 | −0.000707 |
| (2) (C3–C4) | 0.000919 | 0.000691 |
| (3) (C1–C2) + (C3–C4) | −0.000040 | −0.000016 |

FIGS. 3a–3c and FIGS. 5a–5c show comatic aberration plots at first (object) plane OP of the catoptric reduction projection optical systems 5 and 105 of Working Example 1 and Working Example 2, respectively. These comatic aberration plots were obtained by ray tracing from the third (image) plane IP side using 13.4 nm wavelength light.

As can be seen from FIGS. 3a–3c and FIGS. 5a–5c, spherical aberration and coma for EUV light at the single wavelength of 13.4 nm are satisfactorily corrected to a state that is substantially aberration free, and distortion is satisfactorily corrected in the exposure region for both Working Examples 1 and 2.

In Working Example 1 and Working Example 2, the four mirrors M1 to M4 are formed as high-order aspherical surfaces that are rotationally symmetric with respect to optical axis AX. Accordingly, high-order aberrations generated by each reflective mirror M1 to M4 are corrected, and satisfactory imaging performance is achieved. Furthermore, to correct rotationally asymmetric aberration components arising from errors like errors in the surface shape of the reflective surface of each mirror and errors in assembly during the manufacture of the catoptric reduction projection optical system, the rotationally symmetric aspherical surfaces may be formed as rotationally asymmetric aspherical surfaces.

In Working Example 1 and Working Example 2 discussed above, EUV light having a 13.4 nm wavelength is used as the working wavelength. However, the catoptric reduction projection optical system according to the first aspect of the present invention is not so limited. The catoptric reduction projection optical system according to the present invention can also use, for example, light in the hard X-ray region under 5 nm or in the vacuum ultraviolet region of 100–200 nm. Furthermore, synchrotron radiation light, for example, can be used as a light source in the hard X-ray region, and an ArF excimer laser (193 nm wavelength) or an $F_2$ excimer laser (157 nm wavelength) and the like can be used as a light source in the vacuum ultraviolet region.

In Working Example 1 and Working Example 2 discussed above, first catoptric optical system 10 and second catoptric optical system 20 have a reduction magnification. However, for example, first catoptric optical system 10 may have a reduction magnification and second catoptric optical system 20 may have a unity magnification or enlargement magnification, or the first catoptric optical system may have a unity magnification or enlargement magnification and the second catoptric optical system may have a reduction magnification.

Figure 6:
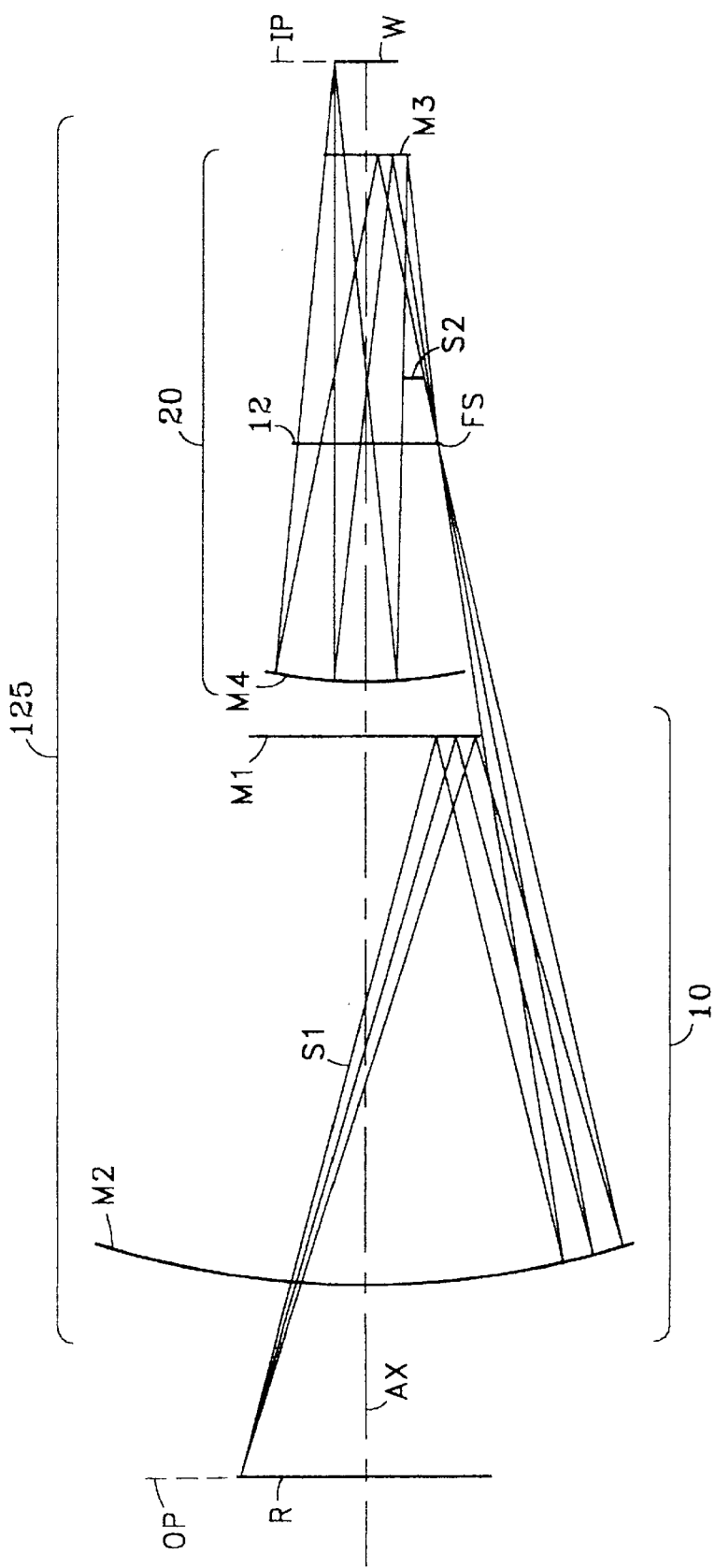
FIG. 6 is a cross-sectional optical diagram of a modified example of the catoptric reduction projection optical system according to the first aspect of the invention.

Each of Working Examples 1 and 2 discussed above are constituted so that aperture stop AS is arranged in the optical path between first (object) plane OP and mirror M1. However, the arrangement of aperture stop AS having a shape that covers the entire circumference of light beam L1 (e.g., an aperture stop having a circular opening) may become difficult if the spacing in the direction orthogonal to optical axis AX between the optical path proceeding from first (object) plane OP to mirror M1 and the optical path proceeding from mirror M1 to mirror M2 narrows. In this case, as disclosed in, for example, Japanese Patent Application Kokai No. Hei 6-230287 and as shown in catoptric reduction projection optical system 125 of FIG. 6, an aperture stop S1 that specifies one part of the peripheral edge of light beam L1 in first catoptric optical system 10 should be provided, and an aperture stop S2 that specifies another part of the peripheral edge of the light beam in second catoptric optical system 20 should also be provided. Aperture stop S1 in first refractive optical system 10 should be arranged at the position of the aperture stop in the catoptric reduction projection optical systems of FIG. 1. Aperture stop S2 in second catoptric optical system 20 should be arranged in the vicinity of the position wherein the principal ray in light beam L1 that proceeds from mirror M3 to mirror M4 traverses optical axis AX.

Second Aspect of the Invention

The second aspect of the catoptric reduction projection optical system of the present invention is now explained in the context of an exposure apparatus EX2 of the present invention.

Figure 7:
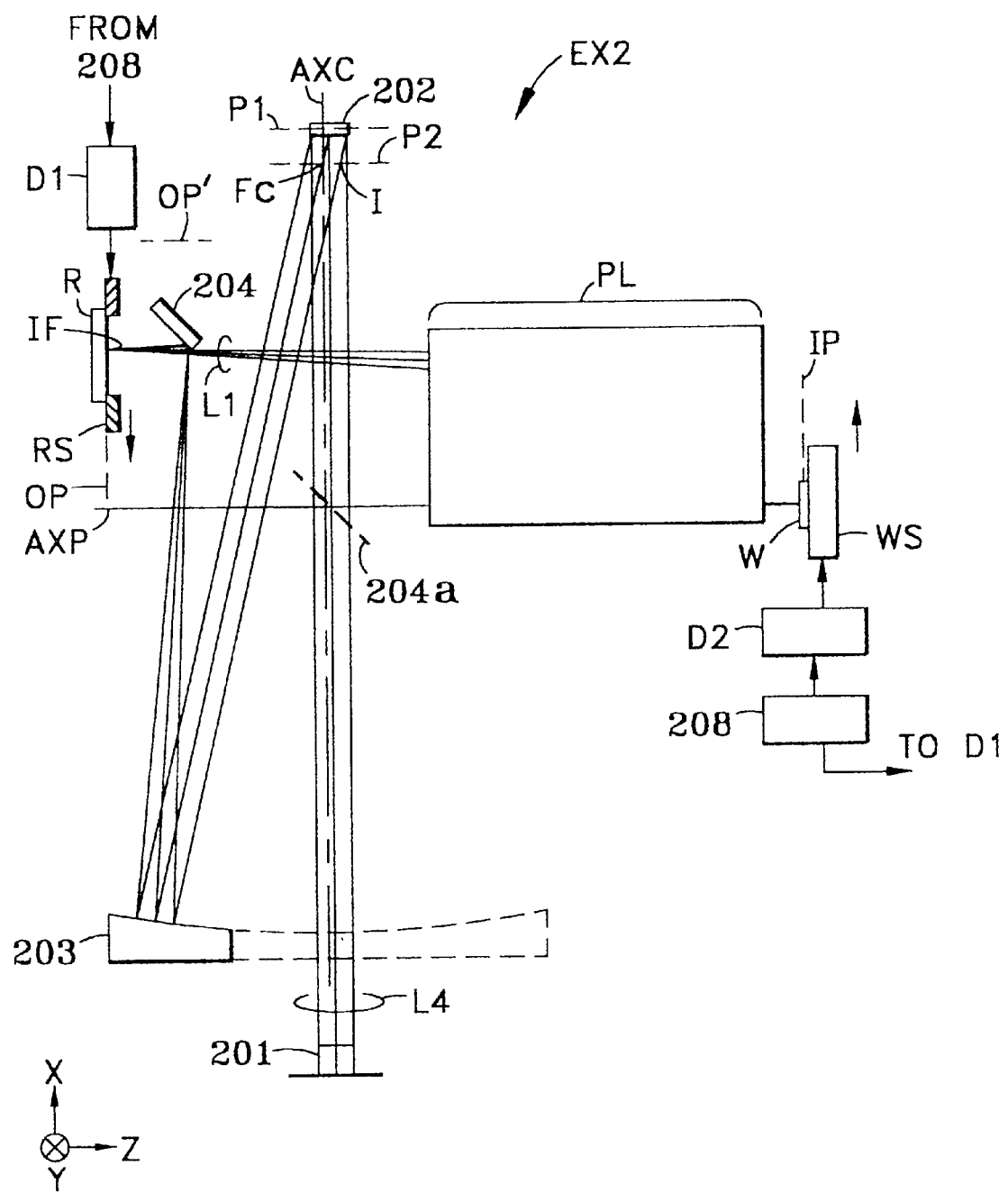
FIG. 7 is a schematic diagram of an exposure apparatus provided with a catoptric reduction projection optical system according to the second aspect of the present invention.
Figure 8:
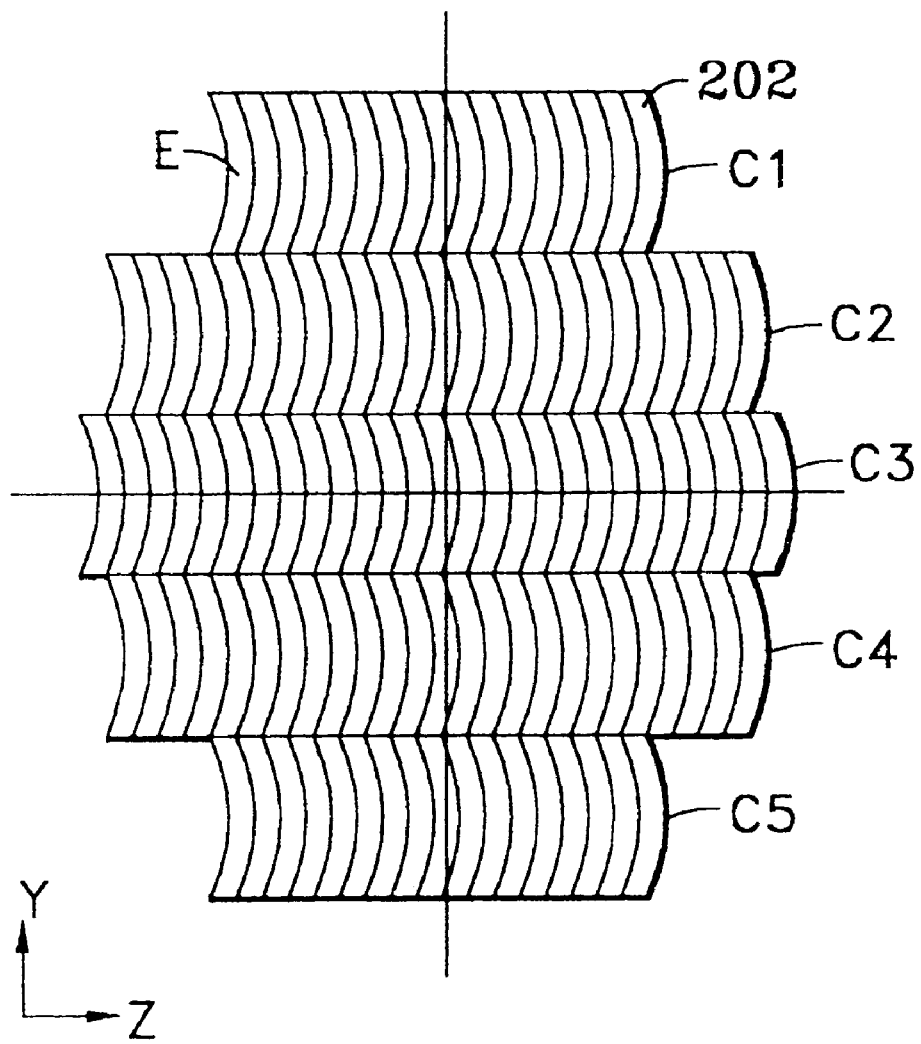
FIG. 8 is a plan view of the reflective element group 202 shown in FIG. 7.

With reference to FIG. 7, a light beam L4 (parallel light beam) supplied by a light source 201, such as a laser light source, is incident substantially perpendicular to a reflective element group 202 as a multi light source forming optical system (optical integrator). With reference also to FIG. 8, reflective element group 202 is constituted so that numerous reflective elements E (optical elements) are densely arranged in two dimensions along a predetermined reference plane P1 perpendicular to the YZ plane. Specifically, as shown in FIG. 8, reflective element group 202 has numerous reflective elements E having reflective curvatures wherein the contour (outline) is formed in an arcuate shape. Furthermore, reflective element group 202 has, along the Y direction, five columns C1–C5 of reflective elements numerously arrayed along the Z direction. Columns C1–C5 are constituted so that they form an overall substantially circular shape. The contour shape (arcuate shape) of each of reflective elements E differs from the shape of an arcuate illumination region IF formed on catoptric reticle R (catoptric reticle) as the surface to be irradiated. Each of reflective elements E has a cut out shape so that the contour (outline) of one part of the reflective curved surface of a predetermined radius of curvature RE (not shown) in a predetermined region off-centered from optical axis AXE (not shown) forms an arcuate shape. The center CE of each of arcuate reflective elements E is positioned at height hE from optical axis AXE. Accordingly, the off-centered reflective surface RSE of each of reflective elements E comprises an eccentric spherical mirror having a predetermined radius of curvature RE. Reflective surface RSE denotes the effective reflective region of reflective elements E that effectively reflects light beam L4 from light source 201. Laser light L4 (parallel light beam) traveling in a parallel direction along optical axis AXE of reflective elements E is converged at focal point position FE on optical axis AXE of reflective elements E, and forms a light source images I.

With continuing reference to FIG. 7, the wavefront of the laser light L4 (parallel light beam) incident substantially perpendicular to reflective element group 202 is divided in an arcuate shape by the reflective action of the numerous reflective elements E. This reflective action forms light source images I, corresponding in number to the numerous reflective elements E, at position P2 deviated from the incident light beam. In other words, if laser light L4 impinges from a parallel direction with respect to each optical axis AXE of the numerous reflective elements E that constitute reflective element group 202, then light source images I are formed by the reflective and converging action of each of reflective elements E, at position P2, which passes through focal point position FE existing on each optical axis AXE. Numerous secondary light sources I are substantially formed at position P2. Accordingly, reflective element group 202 functions as a multi-light source forming optical system that forms numerous light source images I, namely as a multi-light source forming optical system that forms numerous secondary light sources.

The light beam from numerous light source images I is incident a condenser reflective mirror 203 as a condenser optical system having optical axis AXC. Condenser reflective mirror 203 preferably comprises a spherical mirror removed from optical axis AXC. Mirror 203 has a predetermined radius of curvature RC. Optical axis AXC of condenser reflective mirror 203 passes through the center position (position where optical axis AXC intersects with position P2 wherein light source images I are formed) wherein numerous light source images I are formed by reflective element group 202. However, the focal point position of condenser reflective mirror 203 exists on optical axis AXC. Furthermore, optical axis AXC of condenser reflective mirror 203 is parallel to each optical axis AXE of the numerous optical elements E that constitute reflective element group 202. Each light beam from numerous light source images I is reflected and condensed by condenser reflective mirror 203, and then arcuately and superimposingly illuminate catoptric reticle R, as the surface to be irradiated, via a plane fold mirror 204. Center of curvature OIF of arcuate illumination region IF exists on an optical axis AXP of projection optical system PL. In addition, if plane mirror 204 in FIG. 7 is temporarily removed, illumination region IF is formed at the position of surface to be irradiated OP'. Also, center of curvature OIF of illumination region IF in this case exists on optical axis AXC of condenser optical system 203.

Accordingly, optical axis AXC of condenser optical system 203 is not folded 90° by plane mirror 204. However, if optical axis AXC of condenser optical system 203 is folded 90° by a virtual reflective surface 204a of plane mirror 204, then optical axis AXC of condenser optical system 203 and optical axis AXP of projection optical system PL become coaxial on catoptric reticle R. Consequently, optical axes AXC and AXP can be said to be optically coaxial. Thereby, condenser optical system 203 and projection optical system PL are arranged so that each of optical axes AXC, AXP optically pass through center of curvature OIF of arcuate illumination region IF.

As discussed above in connection with the first aspect of the invention, a predetermined circuit pattern is formed on the surface of catoptric reticle R. The latter is supported on a reticle stage RS, which is moveable in two dimensions along the XY plane. The light reflected by catoptric reticle R is imaged via projection optical system PL onto wafer W arranged in image plane IP, and coated with resist, as the photosensitive substrate. The pattern image of arcuate catoptric reticle R is thus projection transferred. Wafer W is held by substrate stage WS, which is moveable in two dimensions along the XY plane.

Reticle stage RS moves in two dimensions along the XY plane via a first drive system D1, operatively connected thereto. Substrate stage WS moves in two dimensions along the XY plane via second drive system D2, operatively connected thereto. The amount of drive of drive systems D1, D2 is controlled by a control system 208 in electronic communication therewith. Accordingly, by control system 208 moving reticle stage RS and substrate stage WS in opposite directions (direction of arrows) via drive systems D1, D2, the entire pattern formed on catoptric reticle R is scanned and exposed onto wafer W via projection optical system PL. Thereby, since a satisfactory circuit pattern is transferred onto wafer W by a photolithographic process that manufactures semiconductor devices, satisfactory semiconductor devices can be manufactured.

Figure 9:
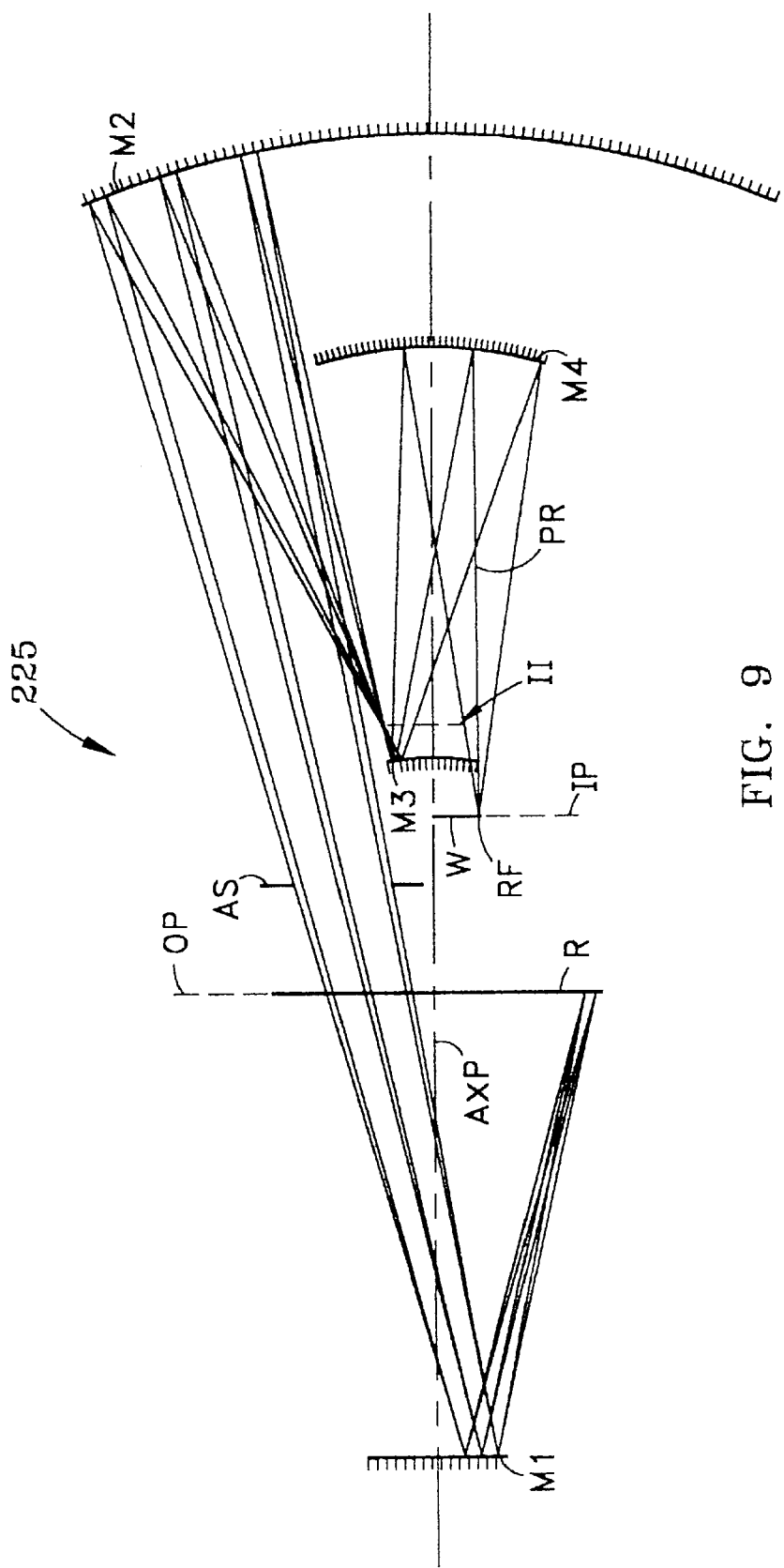
FIG. 9 is a cross-sectional optical diagram of Working Example 3 according to the second aspect of the present invention.

FIG. 9 is a schematic optical diagram of a Working Example 3 of an X-ray lithographic catoptric reduction imaging optical system 225 according to the second aspect of the present invention. System 225 is shown as projection optical system PL in exposure apparatus EX2 of FIG. 7. FIGS. 10a–10c are aberration plots for Working Example 3. System 225 according to the present invention is an X-ray lithographic catoptric reduction imaging optical system comprising along optical axis AXP, in the order in which rays travel from the reticle R side to the wafer W side, reflective mirror M1 having a large radius of curvature, first concave mirror M2, convex mirror M3 and second concave mirror M4. Mirrors M1–M4 are arranged coaxially. System 225 is constituted so that it is imagewise telecentric. Also, an intermediate image II is formed between first concave mirror M2 and convex mirror M3. In addition, a large reduction magnification is produced by first catoptric reduction imaging system comprising mirrors M1 and M2, i.e., the elements between object plane OP to intermediate image II. Reflective mirror M1 has a large radius of curvature, and concave mirrors M2, M4 and convex mirror M3 are each formed as an aspherical surface. The present invention particularly effective in an optical system wherein the absolute value of reduction magnification $\beta$ is $1/3$ to $1/10$.

The catoptric reduction projection optical system according to the second aspect of the present invention avoids eclipsing light beam L1 if the optical system is constituted with a plurality of catoptric systems, even if the NA is larger than 0.1, and without increasing the overall size of the system. Furthermore, aberrations (astigmatism, curvature of field and coma) related to off-axis imaging with respect to an arcuate region (i.e., ring field) RF are more satisfactorily corrected. Consequently, the present invention preferably satisfies the following condition:

$$0.8 < |\beta 1/\beta| < 2 \quad (4)$$

wherein $\beta 1$ is the reduction magnification of the first catoptric reduction imaging system from the object to the intermediate image, and $\beta$ is the reduction magnification of the entire system. If $|\beta 1/\beta|$ exceeds the upper limit in condition (1), a large reduction magnification must be produced by the second imaging system, i.e., mirrors M3 and M4. This unfortunately generates significant coma. If $|\beta 1/\beta|$ falls below the lower limit in condition (1), it becomes difficult to avoid eclipsing light beam L1 when the optical system is constituted with a plurality of reflective systems (i.e., mirrors), increasing the overall size of the optical system.

Although it is acceptable to form intermediate image II between convex mirror M3 and second concave mirror M4, it is also preferable to form it between first concave mirror M2 and convex mirror M3, as previously discussed. Furthermore, intermediate image II is more preferably formed on the convex mirror M3 side of the midpoint of first concave mirror M2 and convex mirror M3.

Each of the curved surfaces of mirrors M2–M4 preferably satisfy the following conditions:

$$|R4| > |R3| \quad (5)$$

$$|R2| > |R4| \quad (6)$$

wherein R2, R3 and R4 are the vertex radii of curvature of first concave mirror M2, convex mirror M3 and second concave mirror M4, respectively. Condition (5) serves to reduce the curvature of field, to control the generation of off-axis aberrations of the arcuate object, to make the overall catoptric optical system more compact, as well as to image reticle R at a predetermined position without eclipsing light beam L1. Condition (6) serves to control the generation of coma at concave mirrors M2, M4, and to arrange first concave mirror M2 more distant than second concave mirror M4 with respect to reticle R. If condition (5) is violated, it becomes difficult to correct the Petzval sum with the first imaging system. Furthermore, if condition (6) is violated, it becomes difficult to control the generation of spherical aberration and coma at concave mirrors M2, M4, and to arrange first concave mirror M2 more distant than second concave mirror M4 with respect to reticle R. Furthermore, reflective mirror M1, having a large radius of curvature, concave mirrors M2, M4 and convex mirror M3 are preferably formed as aspherical surfaces. This allows aberrations (astigmatism, curvature of field and coma) related to off-axis imaging with respect to the arcuate region (ring field RF) to be more satisfactorily corrected.

Reflective mirror M1, having a large radius of curvature, is preferably nearly a plane surface as set forth in the following condition:

$$|R1| > 3000 \text{ mm} \quad (7)$$

wherein R1 is the vertex radius of curvature of mirror M1. A sufficient effect is also obtained even with the following condition:

$$|R1| > 1000 \text{ mm} \quad (8)$$

However, if this range is exceeded, it is not preferable for practical purposes since the curvature of field increases in ring field RF.

The preferred position of aperture stop AS is between reflective mirror M1 and first concave mirror M2. Since ring field RF is imagewise telecentric, the identical exposure conditions are obtained regardless of the location in the ring field.

With continuing reference to FIG. 9, the optical path is folded by reflective mirror M1, having a large radius of curvature. Accordingly, wafer W fortunately does not mechanically interfere with the optical path from reticle R. In addition, since the angle at which light impinges on each of the reflective mirrors M1 to M4 (angle from the normal line of the reflective surface) is substantially close to 0°, the generation of wavefront aberrations caused by phase shifts due to each of the reflective surfaces having a multilayer film is controlled.

Figure 10:
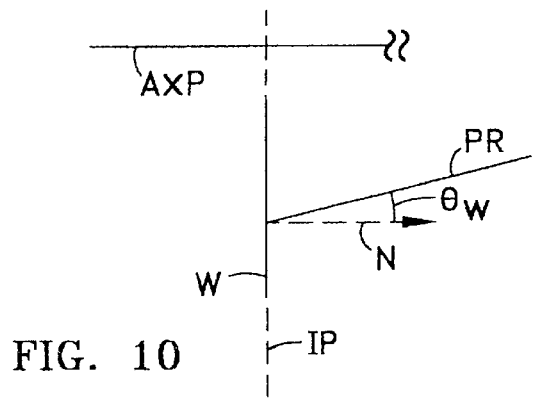
FIG. 10 is a close up view of the image plane of the catoptric reduction optical system of FIG. 9 showing the angle of the principle ray.
Figure 11A:
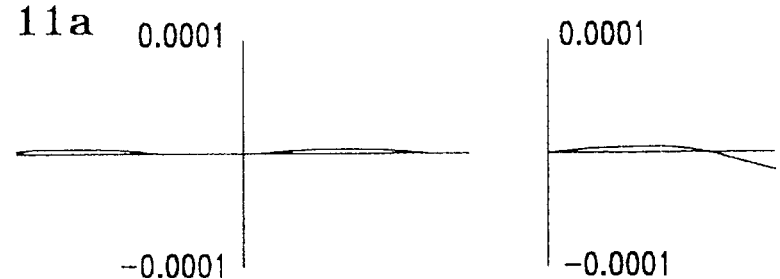
FIGS. 11a–11c are meridional and sagittal comatic aberration plots for Working Example 3 of FIG. 9 for Y=21 mm (FIG. 11a), Y=20.5 mm (FIG. 11b) and Y=20 mm (FIG. 11c)
Figure 11B:
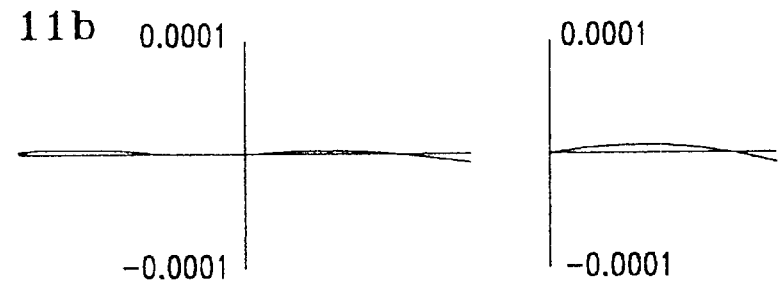
Figure 11C:
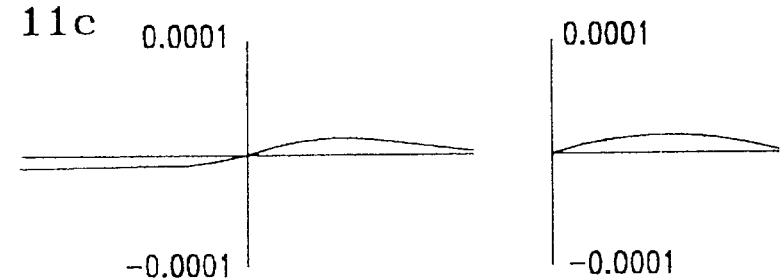
Figure 12:
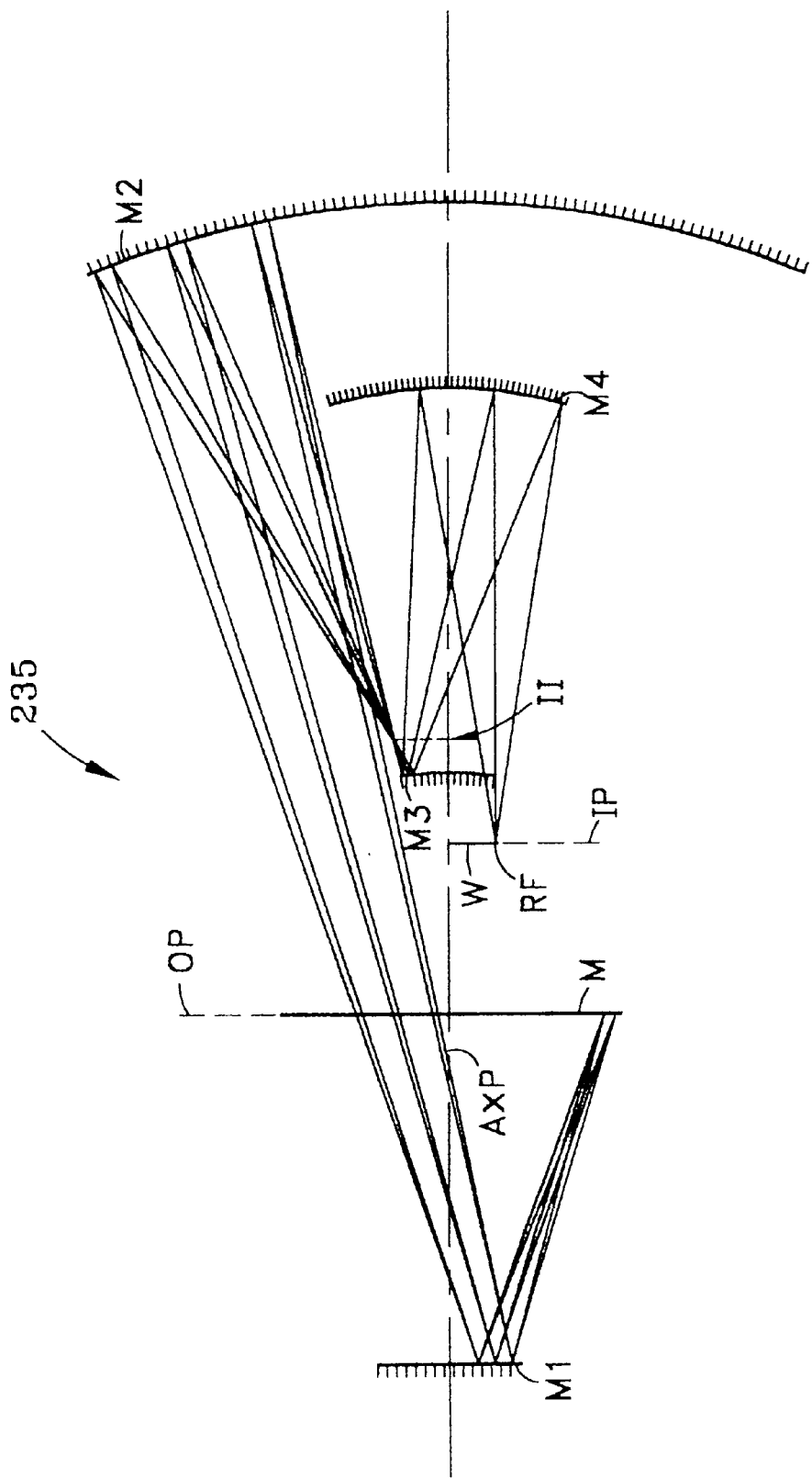
FIG. 12 is a cross-sectional diagram of Working Example 4 according to the second aspect of the present invention.
Figure 13A:
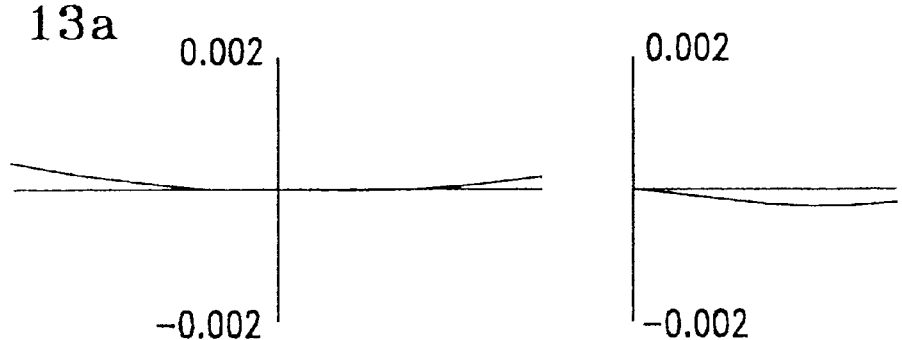
FIGS. 13a–13c are meridional and sagittal comatic aberration plots for Working Example 4 of FIG. 11 for Y=21 mm (FIG. 13a), Y=20.5 mm (FIG. 13b) and Y=20 mm (FIG. 13c).
Figure 13B:
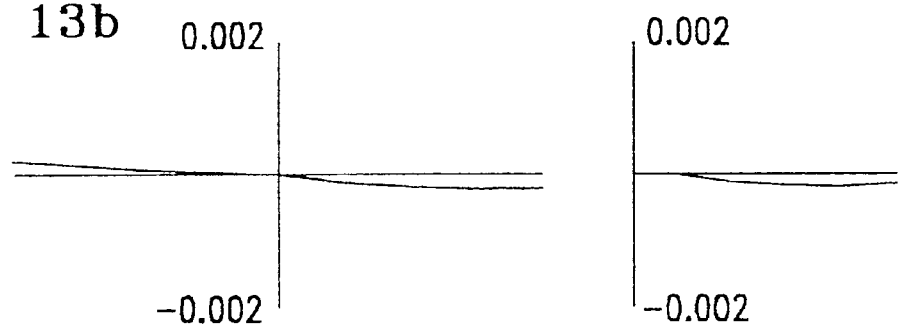
Figure 13C:

As for the term "telecentric" mentioned herein, with reference to FIG. 10, if the off-axis principal ray PR has inclination Θw with respect to a normal line N of image plane IP, the center of gravity of the light beam shifts when defocused relative to image plane IP in which wafer W resides. However, it is preferable that the inclination be up to a point wherein the amount of that shift is less than about ½ of the line width (40 to 70 nm at a wavelength of 13 nm) printed on the wafer. In other words, if NAw is the NA on the wafer W side, if λ is the wavelength of the light source, and if T=resolving power/depth of focus;

$=(0.61\lambda/\text{NAw})/(2\lambda/\text{NAw}^2)$ $=0.30(\text{NAw})$, then Θw (unit: radian) is preferably:

Θw<T/2 and, namely:

Θw<0.15(NAw). (9)

In addition, to further control the shifting of light beam L1, it is preferable to satisfy:

Θw<T/3 and, namely:

Θw<0.10(NAw). (10)

To much further control the shifting of light beam L1, it is optimal to satisfy:

Θw<T/10 and, namely:

Θw<0.030(NAw). (11)

In the catoptric reduction optical system according to the second aspect of the present invention as described above, ring field RF is imagewise telecentric. Thus, the identical exposure conditions are obtained regardless of the location in ring field RF. In addition, since the angle at which light beam L1 is incident each of reflective mirrors M1 to M4 (i.e., angle from the normal line of the reflective surface) is substantially close to 0°, the generation of wavefront aberrations caused by phase shifts due to each reflective surface being formed by a multilayer film is controlled.

The following describes the specifications of the present Working Examples 3 and a Working Example 4. An aspherical surface shape is expressed by the Formula 1, set forth above.

Overall Specifications of Working Example 1

Magnification β: −0.25(−¼)

Magnification β1: −0.302

|β1/β|: 1.208

Θw: 0 (completely telecentric)

NAm on reticle side: 0.0375 (NAw on wafer side: 0.15)

RF inner radius on reticle side: 80 (RF inner radius on wafer side: 20)

RF outer radius on reticle side: 84 (RF outer radius on wafer side: 21)

TABLE 6

Reflective Mirror Specifications of Working Example 3

| Surface No. | RDY | THI | |
|---|---|---|---|
| M | ∞ | 232.425603 | |
| 1 | 9756.48528 | −651.235204 | Aspherical reflective surface |
| | k = 0.000000 | | |
| | A = 0.204538 × $10^{-07}$ | | |
| | B = 0.152945 × $10^{-12}$ | | |
| | C = −0.676190 × $10^{-15}$ | | |
| | D = 0.877334 × $10^{-18}$ | | |
| | E = −0.284115 × $10^{21}$ | | |
| | F = 0.336432 × $10^{-25}$ | | |
| 2 | 420.56661 | 301.582804 | Aspherical reflective surface |
| | k = −0.008362 | | |
| | A = −0.244813 × $10^{-09}$ | | |
| | B = −0.277850 × $10^{-14}$ | | |
| | C = 0.552919 × $10^{-19}$ | | |
| | D = −0.176542 × $10^{-23}$ | | |
| | E = 0.263558 × $10^{28}$ | | |
| | F = −0.174824 × $10^{-33}$ | | |
| 3 | 165.02632 | −196.764001 | Aspherical reflective surface |
| | k = 5.400522 | | |
| | A = 0.218213 × $10^{-06}$ | | |
| | B = −0.182138 × $10^{-08}$ | | |
| | C = 0.591109 × $10^{-11}$ | | |
| | D = −0.974832 × $10^{-14}$ | | |
| | E = 0.577382 × $10^{17}$ | | |
| 4 | 222.63380 | 230.382125 | Aspherical reflective surface |
| | k = 0.024833 | | |
| | A = −0.302273 × $10^{-09}$ | | |
| | B = −0.137150 × $10^{-13}$ | | |
| | C = 0.445752 × $10^{-17}$ | | |
| | D = −0.100607 × $10^{-20}$ | | |
| | E = 0.112666 × $10^{24}$ | | |
| | F = −0.500526 × $10^{-29}$ | | |
| W | ∞ | | |

Overall Specifications of Working Example 2

Magnification β: −0.25(−¼)

Magnification β1: −0.286

|β1/β|: 1.144

Θw: 0 (completely telecentric)

NAm on reticle side: 0.0275 (NAw on wafer side: 0.11)

RF inner radius on reticle side: 80 (RF inner radius on wafer side: 20)

RF outer radius on reticle side: 84 (RF outer radius on wafer side: 21)

TABLE 7

| Surface No. | RDY | THI | |
|---|---|---|---|
| M | ∞ | 232.425603 | |
| 1 | −28012.04588 | −687.502045 | Aspherical reflective surface |
| | k = 0.000000 | | |
| | A = 0.544227 × $10^{-08}$ | | |
| | B = −0.285778 × $10^{-11}$ | | |
| | C = 0.125689 × $10^{-14}$ | | |
| | D = −0.260011 × $10^{-18}$ | | |
| 2 | 422.86751 | 292.386131 | Aspherical reflective surface |
| | k = −0.025861 | | |
| | A = −0.293767 × $10^{-09}$ | | |
| | B = −0.244633 × $10^{-14}$ | | |
| | C = 0.633376 × $10^{-19}$ | | |

TABLE 7-continued

| Surface No. | RDY | THI | |
|---|---|---|---|
| | | $D = -0.242474 \times 10^{-23}$ | |
| | | $E = 0.405770 \times 10^{28}$ | |
| | | $F = -0.282080 \times 10^{-33}$ | |
| 3 | 159.26139 | −195.053964 | Aspherical reflective surface |
| | | $k = 5.599772$ | |
| | | $A = 0.161700 \times 10^{-06}$ | |
| | | $B = -0.104907 \times 10^{-08}$ | |
| | | $C = 0.729989 \times 10^{-11}$ | |
| | | $D = -0.148453 \times 10^{-13}$ | |
| | | $E = 0.106045 \times 10^{16}$ | |
| 4 | 223.10628 | 235.436395 | Aspherical reflective surface |
| | | $k = 0.021440$ | |
| | | $A = -0.366034 \times 10^{-09}$ | |
| | | $B = 0.102933 \times 10^{-13}$ | |
| | | $C = -0.834417 \times 10^{-17}$ | |
| | | $D = 0.209415 \times 10^{-20}$ | |
| | | $E = -0.259827 \times 10^{24}$ | |
| | | $F = 0.126747 \times 10^{-28}$ | |
| W | | ∞ | |

FIGS. 11a–11c and FIGS. 13a–13c show comatic aberration plots at wafer W of the catoptric reduction imaging optical systems of Working Example 3 and a Working Example 4 respectively. These comatic aberration plots were obtained by ray tracing from the reticle R side using light of a 13 nm wavelength. As is evident from FIGS. 11a–11c and FIGS. 13a–13c, Working Examples 3 and 4 have satisfactory imaging performance.

By synchronously scanning reticle R and wafer W with ring field RF according to the present aspect of the invention as described above, an exposure apparatus EX2 having a wide object field is obtained, and an image is obtained with a high resolving power and low distortion within a ring field.

The present aspect of the invention assumes an optical system that prints a pattern with a line width of less than 70 nm and that uses X-rays with a wavelength of 13 nm as the light source. However, it is understood that, since the present optical system comprises reflective mirrors, it can also adequately be used with other wavelengths. Namely, it can also be used with hard X-rays of 1 nm, soft X-rays of 5 to 15 nm, a light source of 126 nm, 146 nm, 157 nm or 172 nm, an ArF excimer laser light source of 193 nm, and a KrF excimer laser light source of 248 nm. As used herein, and in the claims, the term "light" shall include all of the wavelengths discussed above, and X-ray and UV radiation generally.

Reflective mirrors M1, M2, M3, M4 are illustrated in the second aspect of the invention as being symmetric with respect to optical axis AXP. However, it is acceptable even if the mirror portion not used (i.e., the portion that does not reflect rays) is deleted (i.e., off-axis type mirror). In addition, it is substantially identical to the present invention even if it is constituted, for the convenience of the arrangement, by arranging a plane mirror at an arbitrary location in the optical path and folding the optical path in three dimensions.

Working Example 3 in FIG. 7 shows a catoptric reticle R. However, it is understood that the catoptric reduction imaging optical system according to either aspect of the present invention can also use a transparent reticle.

The present invention as described above teaches a catoptric reduction projection optical system that achieves sufficient imaging performance with a simple constitution. The system is ideally suited to, for example, X-ray lithography. By applying the system of the present invention to an exposure apparatus, a satisfactory reticle pattern image can be transferred onto a photosensitive substrate. In addition, by using the system of the present invention in a photolithography process that transfers a reticle pattern image onto a photosensitive substrate, a satisfactory reticle pattern image can be transferred onto the photosensitive substrate. This allows for satisfactory semiconductor devices to be manufactured.

Also, as described above, by using an aberration correction principle different from that in the conventional Offner-type or modified Offner-type optical system, the present invention obtains extremely excellent imaging performance while keeping the number of reflective surfaces relatively small and, furthermore, can improve the imaging performance of an actually manufactured system.

The present invention is not limited to the above modes for carrying out the present invention, and can encompass various constitutions in a range that does not violate the spirit of the present invention as set forth in the appended claims.

What is claimed is:

1. A catoptric reduction projection optical system that forms a reduced image of an object in a first plane onto a third plane, comprising:
   a) a first catoptric optical system, having a first mirror pair comprising two mirrors, that forms an intermediate image of the object onto a second plane;
   b) a field stop arranged in the second plane;
   c) a second catoptric optical system, having a second mirror pair comprising a convex mirror and a concave mirror, that images said intermediate image onto the third plane; and
   d) wherein said first mirror pair, said field stop and said second mirror pair are positioned along an optical axis of the catoptric reduction projection optical system.

2. A catoptric reduction projection optical system according to claim 1, wherein said first catoptric optical system has a reduction magnification, and wherein said second catoptric optical system has a reduction magnification.

3. A catoptric reduction projection optical system according to claim 1, further including:
   a) an aperture stop sized to enclose an entire circumference of a light beam entering said aperture stop, said aperture stop being positioned between the vertices of said two mirrors so as to make the catoptric reduction projection optical system imagewise telecentric.

4. A catoptric reduction projection optical system according to claim 1, wherein said first mirror pair has a concave mirror whose concave surface faces said intermediate image.

5. A catoptric reduction projection optical system according to claim 1, satisfying the following conditions:

$$-0.005 < (C1-C2) < 0.005$$

$$-0.005 < (C3-C4) < 0.005$$

$$-0.005 < (C1-C2)+(C3-C4) < 0.005$$

wherein, C1 and C2 are respective curvatures of said two mirrors, C3 is the curvature of said convex mirror in said second mirror pair, and C4 is the curvature of said concave mirror in said second mirror pair.

6. A catoptric reduction projection optical system according to claim 1, wherein said first catoptric optical system comprises only said two mirrors, and said second catoptric optical system comprises only said convex mirror and said concave mirror.

7. A catoptric reduction projection optical system according to claim 1, wherein
   a) said first catoptric optical system and said second catoptric optical system each comprise a plurality of mirrors arranged along a common optical axis;
   b) said first catoptric optical system and said second catoptric optical system have a predetermined axial spacing therebetween; and
   c) at least two of the mirrors among the plurality of mirrors that constitute said catoptric reduction projection optical system each have an outer diameter that is symmetric with respect to its reference axis.

8. A projection exposure apparatus for forming an image of a pattern present on a reticle onto a photosensitive substrate, the apparatus comprising:
   a) an illumination optical system that guides light of a predetermined wavelength to illuminate the reticle;
   b) the catoptric reduction projection optical system according to claim 1 arranged to receive light from the reticle and to form a reduced image of the reticle pattern onto the photosensitive substrate so as to expose the photosensitive substrate; and
   c) wherein the reticle is illuminated and the photosensitive substrate is exposed while moving the reticle and the photosensitive substrate relative to said catoptric reduction projection optical system.

9. A method of exposing a pattern present on a reticle onto a photosensitive substrate, comprising the steps of:
   a) illuminating a portion of the reticle with light of a predetermined wavelength;
   b) guiding light from the reticle to the catoptric reduction projection optical system of claim 1 so as to form an image of the entire reticle pattern onto the photosensitive substrate; and
   c) scanning the reticle and the photosensitive substrate relative to said catoptric reduction projection optical system so as to form an image of the entire reticle pattern onto the photosensitive substrate.

10. A catoptric reduction projection optical system according to claim 1, wherein said first catoptric optical system and said second catoptric optical system each comprise two reflective mirrors.

* * * * *